United States Patent [19]
Mishima et al.

[11] Patent Number: 5,338,425
[45] Date of Patent: Aug. 16, 1994

[54] TARGET UNITS

[75] Inventors: Akifumi Mishima; Munenori Mashima; Jun Tamura, all of Sanda, Japan

[73] Assignee: Mitsubishi Materials Corporation, Tokyo, Japan

[21] Appl. No.: 904,571

[22] Filed: Jun. 26, 1992

[30] Foreign Application Priority Data

Jun. 28, 1991 [JP] Japan .................................. 3-159131

[51] Int. Cl.⁵ ............................................. C23C 14/34
[52] U.S. Cl. ........................... 204/298.12; 204/298.13; 204/298.21
[58] Field of Search ...................... 204/298.12, 298.13, 204/298.21, 298.22

[56] References Cited

U.S. PATENT DOCUMENTS

| | | | |
|---|---|---|---|
| 3,620,957 | 11/1971 | Emery et al. | 204/298.12 |
| 4,519,885 | 5/1985 | Innis | 204/192 |
| 4,904,362 | 2/1990 | Gaertner et al. | 204/298.12 X |
| 4,966,676 | 10/1990 | Fukasawa et al. | 204/298.12 |
| 5,118,661 | 6/1992 | Maeda | 204/298.12 X |

FOREIGN PATENT DOCUMENTS

| | | |
|---|---|---|
| 3446286 | 6/1986 | Fed. Rep. of Germany . |
| 57941 | 4/1985 | Japan .............................. 204/298.12 |
| 222060 | 9/1987 | Japan .............................. 204/298.12 |

OTHER PUBLICATIONS

Research Disclosure, No. 300, Apr. 1, 1989, p. 286, "Process For Fabricating Sputtering Targets".
Patent Abstracts of Japan, vol. 6, No. 250 (C-139)(1128), & JP-A-57 145 981, Sep. 9, 1982, Katsuya Okumura, "Target For Sputtering Device".
Patent Abstracts of Japan, vol. 10, No. 328 (C-383)(2384), & JP-A-61 136 673, Jun. 24, 1986, Kikuo Suzuki, "Target Material For Sputtering".
Patent Abstracts of Japan, vol. 13, No. 423 (C-638)(3771), & JP-A-11 62 762, Jun. 27, 1989, Kenichi Kubo, "Sputtering Device".

*Primary Examiner*—Nam Nguyen
*Attorney, Agent, or Firm*—Oblon, Spivak, McClelland, Maier & Neustadt

[57] ABSTRACT

The present invention relates to a target unit including a basic body and a target layer mainly comprising Si alloy disposed on an outer peripheral surface of the basic body by a hard-facing method. A target unit in accordance with the present invention has an interposed layer between a basic body and a target layer, in which one side thereof is strongly attached to a peripheral surface of the basic body, while other side thereof is strongly attached to an inner surface of the target layer. Also, a method in accordance with the present invention comprises the steps of: preparing a basic body in the form of a cylinder; applying an interposed layer on a peripheral surface of said basic body by means of hard-facing; and further applying a target layer on a peripheral surface of said interposed layer by means of hard-facing.

12 Claims, 2 Drawing Sheets

& nbsp;
TARGET UNITS

BACKGROUND OF THE INVENTION

1. Field of the Invention

The present invention relates to a target unit including a basic body and a target layer mainly comprising Si alloy disposed on an outer peripheral surface of the basic body by hard-facing method.

2. Prior Art

A planer-type target unit including a target layer made of Si alloy has been used in sputtering systems such as DC-diode sputtering system. In the sputtering process, atoms or groups of atoms are ejected from a surface of the target portion of the system as the result of heavy-ion impact to deposit a thin layer of metal on a glass, plastic, metal, or other surface of materials in vacuum.

However, the above target layer has several disadvantages generated through the sputtering process. For example, only 20% or less of the surface of the target layer is exposed to heavy-ion impact through the sputtering process, while the remaining part is being intact, so that the target layer cannot be used in the sputtering process efficiently. In the above systems, it has been also recognized that oblong shapes are difficult to use as a target, and further the planer-type target unit cannot be adapted to a continuous sputtering process.

Therefore, another type of target units has been proposed. One of the proposed target unit is shown in FIG. 4.

In this figure, a target unit 1 is in the form of a cylinder and comprises a basic body (herein after referred as a backing tube) of stainless steel and a target material (herein after referred as a target layer) 3 of Si alloy uniformity fixed to an outer periphery of the backing tube 2 by the hard-facing.

In the system using the cylinder-type target unit, about 80 to 90% of the surface of the target layer 3 can be subjected to heavy-ion impact through the sputtering process. Thus the system can be adapted to coating a material having a wide surface such as a glass surface, a mirror surface or the like. Therefore, the sputtering system using the cylinder-type target unit will extend its applicable sputtering range.

In spite of the above advantages, however, the target layer 3 of the cylinder-type target unit 1 is easily cracked or broken down as the result of the process of hard-facing. Because a degree of bonding strength between the backing tube 2 of stainless-steel and the target layer 3 of Si alloy is not sufficient to resist physical or mechanical stress such as heat shock or the like caused by the hard-facing process. Consequently, the target layer 3 can be easily pealed off from the backing tube 2.

It is noted that the expanding or contracting rate of the backing tube 2 is different from the one of the target layer 3 under the thermal condition. Therefore, the target layer 3 can be easily pealed off from the baking tube 1 during the sputtering process as a result of weakening the bonding strength between the backing tube 2 and the target layer 3 by thermal fatigue.

SUMMARY OF THE INVENTION

It is therefore the object of the present invention to provide a target unit in which a target layer is strongly united with a basic body through an interposed layer and to provide a fabricating method thereof.

According to the invention, there is provided a target unit having an interposed layer between a basic body and a target layer, in which one side thereof is strongly attached to a peripheral surface of the basic body, while other side thereof is strongly attached to an inner surface of the target layer.

It is preferable that the basic body comprises a material selected from a group of stainless-steel, Cu alloy having 0.02% of Zr and 0.5% of Cr and oxygen-free copper, and the interposed layer comprises at least one element selected from Mo, Ti, W and Ni.

It is also preferable that the target layer is divided into two regions along a radial direction thereof: an inner region adjoining to the interposed layer comprising Si and at least one element selected from a group of Cr, Ti and Zr, in which a content of the selected element is gradually decreased from an inner side of said inner region to an outer side thereof; and an outer region comprising Si and at least one element selected from a group of Cr, Ti, and Zr, in which a content of said selected element is constant, or an outer region comprising Si and at least one element selected from a group of B and P, in which a content of said selected element is constant.

It is further preferable that the interposed layer has at least two layers: an inner layer adjoining said basic layer; and an outer layer adjoining said target layer, in which the outer layer comprises Ni.

According to the invention there is also provided to a method of fabricating the above target unit. The method comprises the steps of: preparing a basic body in the form of a cylinder; applying an interposed layer on a peripheral surface of said basic body by means of hard-facing; and further applying a target layer on a peripheral surface of said interposed layer by means of hard-facing.

DESCRIPTION OF THE PREFERRED EMBODIMENT OF THE INVENTION

Figure 1:
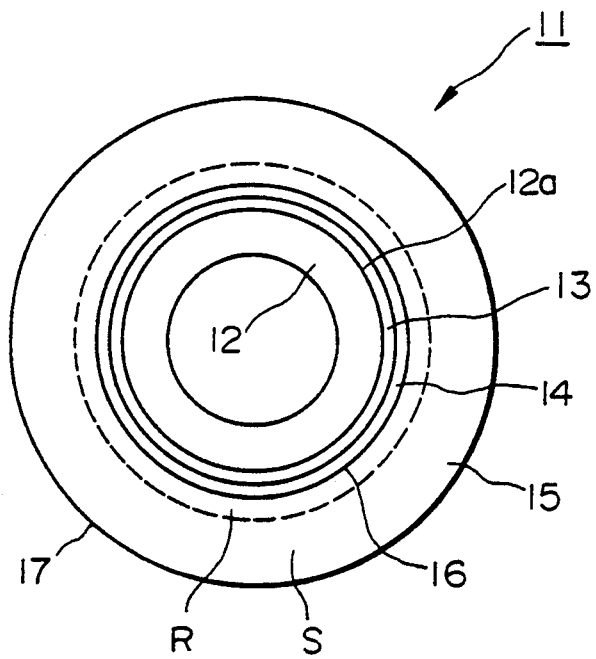
FIG. 1 is a plan view showing a target unit in accordance with the invention.

Various embodiments of the present invention will now be described with reference to the accompanying drawings in which the same reference numerals are used to designate like parts or elements in several different views. Unless otherwise indicated, all percentages and ratios are by weight.

FIG. 1 depicts a target unit in accordance with the present invention. The target unit 11 includes a backing tube 12 as a base body, first and second interposed layers 13, 14 and a target layer 15. As shown in the figure, these layers 13, 14 and 15 are concentrically formed with the backing tube 12.

The backing tube 12 is made of a non-magnetic material having several physical properties such as high mechanical strength, high thermal conductivity, anti-corrosion, heat resistance, low thermal expansion, and the like. Also, the first and second interposed layers 13, 14 are made of a non-magnetic material which is easily attached to the peripheral surface of the backing tube and non-reactive with the outer layers. This material should have several physical properties such as low thermal expansion and the like. Further, each of these non-magnetic materials should have almost the same thermal expansion co-efficient as the Si alloy used for the target layer 15 to avoid cracking or pealing of the target layer under the sputtering process. Consequently, each part of the target unit 11 is constructed as follows so as to satisfy the above requirements.

The backing tube 12 comprises one composition selected from a group of stainless steel, copper alloy having 0.02% of Zr and 0.5% of Cr, and oxygen-free copper. Because these materials have high anti-corrosion properties in an oxidation or reduction atmosphere and high thermal conductivity.

The first interposed layer 13 is disposed on the outer peripheral surface 12a of the backing tube 12 and comprises one element selected from a group of Ti, Mo, and W for strongly attaching with the backing tube 12, while the second interposed layer 14 is disposed on the first layer 13 and comprises Ni for strongly attaching with the target layer 15.

The target layer 15 is disposed on the second layer 14 and comprises Si and at least one other element selected from Ti, Zr, Cr, B and P. Because these elements are not only responsible for decreasing a high electrical resistivity of the Si element to improve an electric conductivity of the target layer 15 but also responsible for Improving mechanical strength and thermal resistivity to avoid cracking of the target layer 15 or pealing the target layer 15 from the backing tube 12 under the sputtering process. If the target layer consists of Si element, the sputtering process cannot be performed because the Si element is known as an intrinsic semiconductor having high electrical resistivity.

In FIG. 1, the target layer 15 is radially divided into two regions, i.e., an inner region as indicated by "R" comprising Si and at least one element selected from a group of Ti, Zr and Cr with a gradient of a content of the selected element and an outer region as indicated by "S" comprising Si and at least one element selected from a group of Ti, Zr, Cr, B and P and having a constant content of the selected element.

It is preferable that the hard-facing is performed by plasma hard-facing method in which molten material is uniformly applied on the outer peripheral surface 12a of the backing tube 12 by using plasma gas generated in an atmosphere or non-reactive gas atmosphere.

In the case of applying the target layer 15 on the outer peripheral surface the interposed layer 13, 14, a mixture of Si element and at least one other element selected from a group of Cr, Ti and Zr is supplied into a plasma jet generated from plasma torch (not shown). During the hard-facing, an amount of each element is being controlled so as to provide a mixture with its predetermined mixing ratio. In practice, each element is provided as a cluster of micro-particles. Thus the plasma gas softens the Si particles, and simultaneously melts Cr, Ti and Zr particles. These softened or molten particles are sprayed with the plasma jet from the plasma torch to apply the surface of the backing tube 1.2 with the particles. After that, the particles applied on the backing tube 12 become solidified to form a layer comprising a mixture of Si and at least one element selected from a group of Cr, Zr and Ti at a predetermined ratio. If the mixing ratio of these elements is gradually varied through the hard-facing process, an alloy phase having a gradient of the element's content can be obtained.

In a first embodiment of the present invention, both regions of the target layer comprise same element selected from a group of Cr, Zr and Ti. When Cr is selected as the element of the target layer, a profile of the Cr content is as indicated in FIG. 2.

Figure 2:
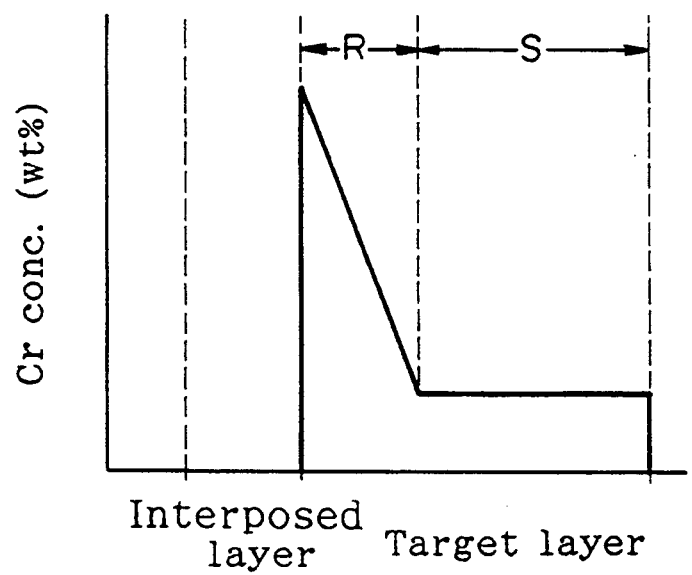
FIG. 2 is a graph showing Cr concentration of each cross-sectional portion of the target unit in accordance with the first embodiment of the invention.

FIG. 2 is a graph showing a variation of the Cr content in the target layer 15. A vertical axis represents the Cr content, while a horizontal axis represents a distance from a center of the target unit 11. In the "R" region, the amount of Cr is gradually changed along the radial direction. That is, Cr content of the inner side of the "R" region adjoining a boundary face 16 against the interposed layer 14 is much greater than that of the outer side of the "R" region adjoining the "S" region.

In a second embodiment of the present invention, the "R" region comprises Si and at least one element selected from a group of Cr, Zr and Ti, while the "S" region comprises Si and at least one other element selected from a group of Cr, Zr, Ti, B and P which is not comprised in the "R" region.

Figure 3:
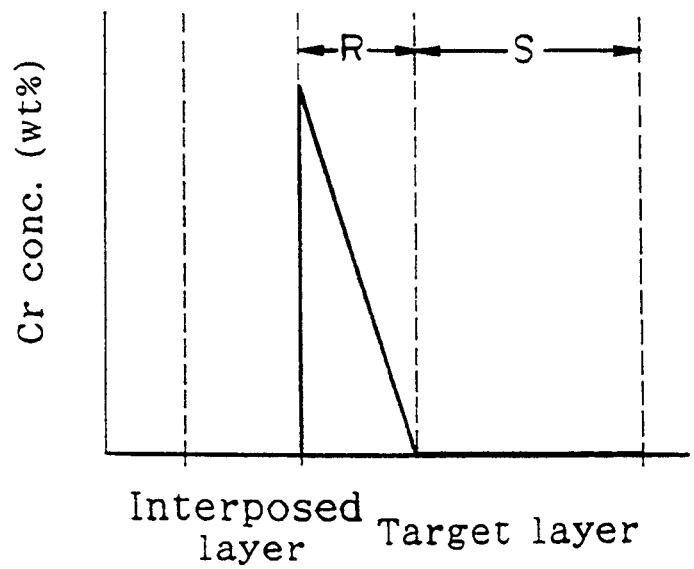
FIG. 3 is a graph showing Cr concentration of each cross-sectional portion of the target unit in accordance with the second embodiment of the invention.
Figure 4:
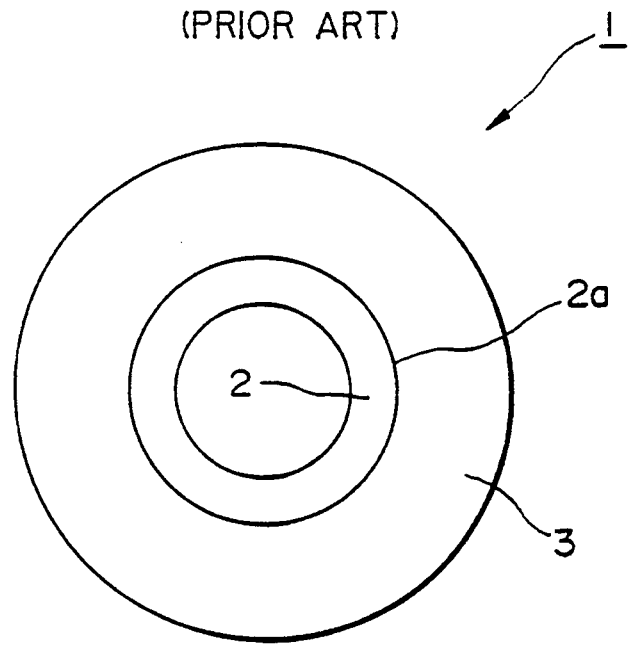
FIG. 4 is a plan view of a conventional target unit.

When Cr is selected as the element of the "R" region of the target layer, a profile of the Cr content is as indicated in FIG. 3 because the "S" region of target layer does not contain the Cr element.

As shown in the figure, the amount of Cr is gradually changed along the radial direction in the "R" region. That is, Cr content of the inner side of the "R" region adjoining a boundary face 16 against the interposed layer 14 is much greater than that of the outer side of the "R" region adjoining the "S" region. On the other hand, the Cr element is not present in the "S" region. The "S" region comprises Si and at least one other element selected from a group of Zr, Ti, B and P instead of Cr.

The above described target units 11 is fabricated as follows.

Firstly, a backing tube 12 of a cylindrical shape comprising stainless steel is prepared by the conventional method. The obtained backing tube 12 has an outer diameter of 150 mm, an inner diameter of 120 mm, and a length of 1,000 mm.

Secondly, interposed layers 13, 14 and a target layer 15 are applied on a peripheral surface 12a of the backing tube 12 by a method of plasma hard-facing under the following conditions (a) and (b).

(a) condition for preparing the interposed layers:

| gas used for the hard-face: | Ar, $H_2$ |
| --- | --- |
| plasma arc voltage: | 50 V |
| arc current: | 500 A |
| gas flow rate: | 50 l/min. |

(b) condition for preparing the target layer of Si alloy:

| gas used for the hard-face: | Ar, $H_2$ |
| --- | --- |
| plasma arc voltage: | 60 V |
| arc current: | 600 A |
| gas flow rate: | 55 l/min. |

EXAMPLE 1

A first interposed material of Mo was applied on an outer peripheral surface of the backing tube of stainless-steel so as to make a first interposed layer having a thickness of about 30 μm, and then a second interposed material comprising Ni was applied on a surface of the first interposed layer on the backing tube 12 so as to make a second interposed layer having a thickness of about 20 μm.

The backing tube 12 having two interposed layers was further processed by applying a constant amount of target material comprising Si and Cr on the second interposed layer by the head-facing, while an amount of Cr in the target material was gradually decreased through the application so as to make a gradient of Cr content in the resulting target layer 15 having a thickness of about 0.2 mm.

The target unit obtained by the above process was compared with the conventional target unit with respect to the crack appearance under the hard-facing and sputtering processes.

EXAMPLE 2

Using the same procedure as in Example 1, except that the first interposed layer was made of Ti, the target unit was obtained.

EXAMPLE 3

Using the same procedure as in Example 1, except that the target layer of Si alloy includes Ti in the "R" region and Cr in the "S" region, the target unit having a gradient of Ti content was obtained.

EXAMPLE 4

Using the same procedure as in Example 1, except that the first interposed layer was made of W instead of Mo and the target layer of Si alloy included Zr in the "R" region and Cr in the "S" region, the target unit having a gradient of Zr content was obtained.

EXAMPLE 5

Using the same procedure as in Example 1, except that the backing tube 12 was made of a copper alloy (0.02% Zr, 0.5% Cr, and the remains of Cr), the first interposed layer was made of Ti instead of Mo, the target layer of Si ally includes Ti in both regions.

EXAMPLE 6

Using the same procedure as in Example 1, except that the baking tube was made of oxygen-free copper, the first interposed layer was made of Ti instead of Mo, and also the target layer of Si alloy included Zr in the "R" region and Cr in the "S" region, the target unit having a gradient of Zr content was obtained.

EXAMPLE 7

Using the same procedure as in Example 1, except that the "R" region has about 0.5 mm thickness and is made of Si alloy comprising Si and Cr, while the "S" region has about 5.5 mm thickness and is made of Si alloy comprising Si and B, the target unit having a gradient of Cr content was obtained.

EXAMPLE 8

Using the same procedure as in Example 7, except that the first interposed layer was made of Ti and the "R" region was made of Si and Ti, the target unit having a gradient of Ti content was obtained.

EXAMPLE 9

Using the same procedure as in Example 7, except that the first interposed layer was made of Zr and the target layer of Si alloy includes Ti in the "R" region and P in the "S" region, the target unit having a gradient of Ti content was obtained.

EXAMPLE 10

Using the same procedure as in Example 7, except that the first interposed layer was made of W instead of Mo, the target unit was obtained.

EXAMPLE 11

Using the same procedure as in Example 7, except that the backing tube was made of copper alloy (0.02% Zr, 0.5% Cr, and the remains of Cr), the first interposed layer was made of Ti instead of Mo, the target layer of Si ally includes Ti in the "R" region and B in the "S" region, the target unit having a gradient of Ti was obtained.

EXAMPLE 12

Using the same procedure as in Example 7, except that the baking tube was made of oxygen-free copper, the first interposed layer was made of Ti instead of Mo and the target layer of Si alloy included Zr in the "R" region and B in the "S" region, the target unit having a gradient of Zr content was obtained.

COMPARATIVE EXAMPLE 1

Using the same procedure as in Example 1, except that the interposed layers were not formed, the target unit was obtained.

COMPARATIVE EXAMPLE 2

Using the same procedure as in Example 5, except that the interposed layers were not formed, the target unit was obtained.

As shown in the table, the target units in accordance with the present invention showed excellent resistance against physical stresses under the above processes in comparison with the conventional ones, i.e., the target layer of the novel target unit was retained its construction stable not only under the hard-facing process but also under the sputtering process. On the other hand, the target layer of the conventional target unit was easily pealed off from the backing tube or cracked under the above processes. Consequently, the target unit of the present invention has an improved boding strength between the basic body and the target layer to provide a high mechanical strength against physical stresses under the hard-facing and sputtering processes.

TABLE 1

Influence of the hard-facing and sputtering processes on the target units prepared by the Examples 1–12 and the Comparative Examples 1–6.

| No. | Backing tube | Interposed layer 1st | Interposed layer 2nd | Target layer "R" | Target layer "S" | Results HF | Results SP |
|---|---|---|---|---|---|---|---|
| Examples | | | | | | | |
| 1 | SUS | Mo | Ni | Si + C | Si + 5% Cr | — | — |
| 2 | SUS | Ti | Ni | Si + C | Si + 5% Cr | — | — |
| 3 | SUS | Mo | Ni | Si + Ti | Si + 4% Cr | — | — |
| 4 | SUS | W | Ni | Si + Z | Si + 3% Ti | — | — |
| 5 | OMC | Ti | Ni | Si + Ti | Si + 3% Ti | — | — |
| 6 | OFC | Ti | Ni | Si + Z | Si + 3% Ti | — | — |
| 7 | SUS | Mo | Ni | Si + C | Si + B | — | — |
| 8 | SUS | Ti | Ni | Si + Ti | Si + B | — | — |
| 9 | SUS | Zr | Ni | Si + Z | Si + P | — | — |

TABLE 1-continued

Influence of the hard-facing and sputtering processes on the target units prepared by the Examples 1-12 and the Comparative Examples 1-6.

| No. | Backing tube | Interposed layer 1st | Interposed layer 2nd | Target layer "R" | Target layer "S" | Results HF | Results SP |
|---|---|---|---|---|---|---|---|
| 10 | SUS | W | Ni | Si + Ti | Si + B | — | — |
| 11 | OMC | Ti | Ni | Si + Ti | Si + B | — | — |
| 12 | OFC | Ti | Ni | Si + Z | Si + B | — | — |
| Comparative Examples | | | | | | | |
| 1 | SUS | — | — | Si + Cr | Si + 5% Cr | — | P |
| 2 | OMC | — | — | Si + Ti | Si + 3% Ti | PP | C |
| 3 | OFC | — | — | Si + Zr | Si + 3% Ti | PC | C |
| 7 | SUS | — | — | Si + Cr | Si + B | PC | C |
| 11 | OMC | — | — | Si + Ti | Si + B | PC | C |
| 12 | OFC | — | — | Si + Zr | Si + B | C | P |

COMPARATIVE EXAMPLE 3

Using the same procedure as in Example 6, except that the interposed layers were not formed, the target unit was obtained.

COMPARATIVE EXAMPLE 4

Using the same procedure as in Example 7, except that the interposed layers were defected, the target unit was obtained.

COMPARATIVE EXAMPLE 5

Using the same procedure as in Example 11, except that the interposed layers were defected, the target unit was obtained.

COMPARATIVE EXAMPLE 6

Using the same procedure as in Example 12, except that the interposed layers were defected, the target unit was obtained.

Table 1 below shows the results obtained from subjecting each target unit prepared by the examples 1-12 and the comparative examples 1-6 into the hard-facing process and the sputtering process.

In the table, each abbreviation indicates as follows:

1st=First interposed layer; 2nd=Second interposed layer; HF=Hard-face process; SP=Sputtering process; SUS=Stainless-steel; OMC=Copper alloy (Cu, 0.02% Zr and 0.5% Cr); OFC=Oxygen-free copper; P=The target layer was peeled off from the backing tube; PP=The target layer was partially peeled off from the backing tube; C=The target layer was cracked; and PC=The target layer was partially cracked.

What is claimed is:

1. A sputtering target comprising:
   a cylindrical substrate having an outer peripheral surface;
   a target layer provided on said outer peripheral surface of said substrate, said target layer being formed of a silicon alloy containing at least one ingredient selected from the group consisting of Cr, Ti and Zr; and
   an intermediate layer interposed between said target layer and said substrate;
   wherein said target layer has an inner portion adjoining said intermediate layer and an outer portion disposed away from said intermediate layer, said at least one ingredient in said silicon alloy being present in a greater concentration in said inner portion than in said outer portion.

2. A sputtering target as recited in claim 1, wherein said at least one ingredient in said inner portion of said target layer is present at a concentration gradient which gradually decreases in an outward direction from said intermediate layer to said outer portion.

3. A sputtering target as recited in claim 1, wherein said substrate is formed of a material selected from the group consisting of stainless steel, copper alloy and oxygen-free copper.

4. A sputtering target as recited in claim 1, wherein said intermediate layer consists essentially of at least one element selected from the group consisting of Mo, Ti, W, and Ni.

5. A sputtering target as recited in claim 4, wherein said intermediate layer includes a plurality of sublayers.

6. A sputtering target as recited in claim 5, wherein said intermediate layer has an outermost sublayer consisting essentially of Ni.

7. A sputtering target comprising:
   a cylindrical substrate having an outer peripheral surface;
   a target layer provided on said outer peripheral surface of said substrate; and
   an intermediate layer interposed between said target layer and said substrate;
   wherein said target layer has an inner portion adjoining said intermediate layer and an outer portion disposed away from said intermediate layer, said inner portion being formed of a silicon alloy containing at least one ingredient selected from the group consisting of Cr, Ti and Zr, said outer portion being formed of a silicon alloy containing at least one ingredient selected from the group consisting of B and P.

8. A sputtering target as recited in claim 7, wherein said at least one ingredient in said inner portion of said target layer is present at a concentration gradient which gradually decreases in an outward direction from said intermediate layer to said outer portion.

9. A sputtering target as recited in claim 7, wherein said substrate is formed of a material selected from the group consisting of stainless steel, copper alloy and oxygen-free copper.

10. A sputtering target as recited in claim 7, wherein said intermediate layer consists essentially of at least one element selected from the group consisting of Mo, Ti, W, and Ni.

11. A sputtering target as recited in claim 10, wherein said intermediate layer includes a plurality of sublayers.

12. A sputtering target as recited in claim 11, wherein said intermediate layer has an outermost sublayer consisting essentially of Ni.

* * * * *